May 15, 1956 B. D. GRIFFITH 2,745,960

SEMI-CONDUCTOR SIGNAL GENERATOR

Filed June 23, 1953

INVENTOR.
Brooks D. Griffith

BY H. L. Newton

ATTORNEY

United States Patent Office 2,745,960 Patented May 15, 1956

2,745,960

SEMI-CONDUCTOR SIGNAL GENERATOR

Brooks D. Griffith, Maple Shade, N. J., assignor to Radio Corporation of America, a corporation of Delaware Application June 23, 1953, Serial No. 363,633

9 Claims. (Cl. 250—36)

Figure 1:
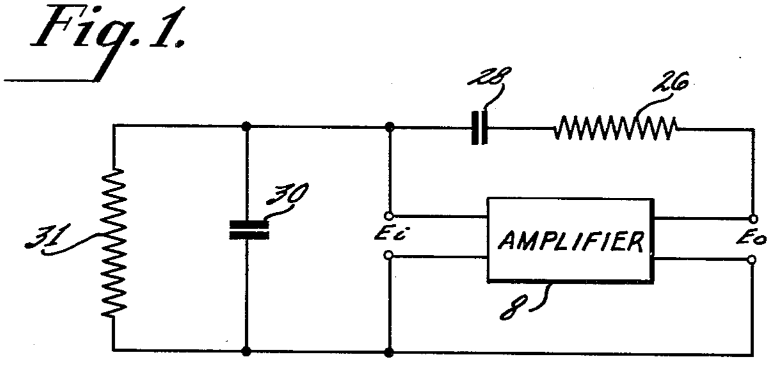

This invention relates to electrical signal generators or oscillators, and more particularly to oscillator circuits wherein semi-conductor devices are utilized as the signal amplifier element.

The recent development of commercially useful semi-conductor devices of the type employing a semi-conductive element having three contacting electrodes has already had a decided effect upon and has caused the introduction of many new techniques in the electronic signal communication field. These devices, known extensively as "transistors," are small in size, especially when compared with the ordinary vacuum tube, require no heater power, are very durable, and consist of materials which appear to have a long useful life. Therefore, the use of transistors in oscillator, as well as other, circuits has been the subject of some investigation.

The majority, but not all, vacuum tube oscillators can be classified as being either of the negative resistance or of the feedback type. Under the first classification is included those oscillators in which sustained oscillation results because of the inherent negative resistance characteristics of the tube itself. A feedback oscillator can be considered as a tuned feedback amplifier in which the amplitude and phase angle of the feedback voltage are such as to cause sustained oscillation. Generally the feedback voltage must be in phase with the input voltage and of sufficient magnitude to compensate for normal circuit losses in order to sustain oscillations. Oscillator circuits in which transistors are utilized as the amplifier element can also, in general, be classified in the same manner as those using vacuum tubes, even though the characteristics of transistors differ widely from those of the vacuum tube.

In one type of feedback oscillator utilizing vacuum tubes, which is especially useful for audio frequency applications, a resistance-capacitance network provides a regenerative coupling between the output and input circuits of a feedback amplifier.

Thus, wire-wound inductors are not necessary and less expensive resistors may be used.

While the resistance-capacitance feedback oscillator has these inherent advantages, if a three electrode vacuum tube (i. e., a triode) is used in such a circuit, a relatively complicated resistance-capacitance network is required to obtain the necessary phase shift, which is substantially 180 degrees. This is because the output signal on the anode of a triode is in phase opposition to the input signal on the grid.

One special type of resistance-capacitance feedback oscillator which has been a success commercially is the Wein-bridge oscillator circuit in which a frequency-selective Wein-bridge is used as the resistance-capacitance feedback network. In addition to the aforementioned advantages of resistance-capacitance feedback oscillators, the Wein-bridge oscillator is characterized by frequency stability and a relatively constant output amplitude over a wide frequency range. The wave shape of such an oscillator is very nearly a true sine-wave.

However, Wein-bridge oscillators generally require two electron-tube stages in order that the feedback voltage will be in phase with the input voltage. One alternative to two amplifier stages is the utilization of a multi-grid tube such as a pentode as the oscillator element. Since the voltage amplification factor, as defined by the ratio of the suppressor to the screen grid voltage, of a pentode is negative throughout a portion of the operating voltages, the output voltage may be made in phase with the input voltage by impressing the input signal on the suppressor of the pentode and deriving the output voltage from the screen grid. Wein-bridge oscillators may not be constructed, however, using a single triode electron tube as the amplifier element.

The present invention substantially overcomes these disadvantages of the prior art electron-tube resistance-capacitance feedback oscillators by utilizing a single transistor as the oscillator element. Thus, the disadvantages of complicated phase-shifting feedback networks, two amplifier stages, or multi-electrode oscillator elements of the prior art electron tube circuits are overcome, while the inherent advantages of transistor circuits such as small size, absence of heater power, durability and long useful life are realized.

It is, accordingly, a principal object of the present invention to provide a feedback oscillator circuit which is tuned by a resistance-capacitance network and which utilizes a single transistor as the amplifier element.

It is another object of the present invention to provide a Wein-bridge type feedback oscillator circuit wherein a single transistor is utilized as the amplifier element.

These and further objects and advantages of the present invention are achieved by connecting a transistor for grounded base operation as the amplifier element in a feedback oscillator circuit. A network comprising a simple Wein-bridge is connected between the collector and emitter electrodes of the transistor and provides the necessary feedback for sustained oscillation.

Figure 2:
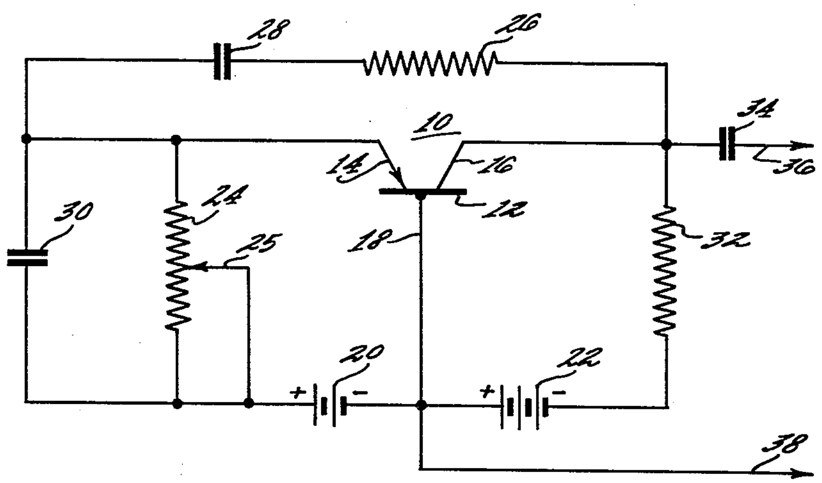

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a resistance-capacitance oscillator of the type to which the invention relates; and Figure 2 is a schematic circuit diagram of a resistance-capacitance oscillator utilizing a transistor as the amplifier element and embodying the invention.

Referring now to the drawing, and particularly to Figure 1, a resistance-capacitance feedback oscillator may include an amplifier 8, having a pair of input terminals, to which an input volage $E_1$ is applied, and a pair of output terminals from which an output voltage $E_0$ may be derived. The feedback circuit for the amplifier 8 is a Wein-bridge comprising a resistor 26 and a capacitor 28 connected in series between one output terminal and one of the input terminals, and the parallel R-C combination comprising a capacitor 30 and a resistor 31 which shunts the input terminals. For further details and advantages of such an oscillator reference is made to H. J. Reich's Theory and Application of Electron Tubes, 2d edition, 1944, McGraw-Hill Publishing Company, page 396. It can be shown that the frequency of oscillation of the oscillator circuit illustrated in Figure 1 is given by the expression:

$$f=\frac{1}{2\pi\sqrt{R_1R_2C_1C_2}}$$

where $f$=frequency;

$R_1$=resistance of resistor 26;
$R_2$=resistance of resistor 31;
$C_1$=capacitance of capacitor 28; and
$C_2$=capacitance of capacitor 30.

The minimum voltage gain necessary for sustained oscillation is determined by the expression:

$$A=1+\frac{R_1}{R_2}+\frac{C_2}{C_1}$$

where $A$=minimum voltage gain.

Thus, it is apparent that by making $R_1$ and $C_2$ (resistor 26 and capacitor 30) relatively large with respect to $R_2$ and $C_1$ (resistor 31 and capacitor 28) respectively, the necessary voltage gain for oscillation may be made to approach unity. Furthermore, it is evident that the vector voltage gain of the amplifier 8 must be real and positive for sustained oscillation. Accordingly, the portion of the output voltage $E_0$ which is fed back to the input terminals must be in phase with the input voltage $E_1$ and of sufficient amplitude to compensate for normal circuit losses.

As was hereinbefore explained, this criterion for sustained oscillation cannot be achieved in a circuit of this type using a single triode electron tube.

The characteristics of a transistor are considerably different from the characteristics of the conventional triode electron tube. Thus, at low frequencies, the grid of a vacuum tube draws practically no current, whereas all three of the electrodes of a transistor draw current. Furthermore, transistors are current, as opposed to voltage, operated devices. It is also to be noted that point-contact transistors have a current gain which is greater than unity, i. e., the collector current is greater than the emitter current. Accordingly, point-contact transistors can furnish current amplification as well as voltage amplification. Of equal importance is the fact that for grounded base operation, the signal in the collector will be in phase with the signal in the emitter, as opposed to the phase opposition condition between the signals on the grid and anode of the triode.

These differences between the characteristics of the transistor on the one hand, and a triode electron-tube on the other, make possible the construction of a simple resistance-capacitance feedback oscillator circuit or oscillation generator in which a single three electrode transistor may be used as the amplifier element without requiring a phase-shifting network. Such an oscillation generator is illustrated in Figure 2, reference to which is now made.

The amplifier element for the oscillation generator comprises a transistor 10 having a semi-conductive body 12 and three contacting electrodes. Thus, an emitter 14, a collector 16, and a base 18 are in contact with the semi-conductive body 12.

The transistor 10 is of the current multiplication point-contact type and in the drawing has been illustrated as being an N-type point-contact transistor. It should be understood, however, that a P-type point-contact transistor may be used by reversing the polarity of the biasing voltages. In general, transistors of either type which are short-circuit stable are preferred.

Proper biasing, that is, operating bias voltage for the transistor 10 is derived from a suitable source such as batteries 20 and 22. To provide a direct current conductive path for the collector 16, it is connected serially through a resistor 32 to the negative terminal of the battery 22. The emitter 14 is connected through a resistor 24 having a variable tap 25, to the positive terminal of the battery 20. It should be understood that the batteries 20, 22 may be by-passed for signal frequencies by suitable by-pass capacitors if desired. The base 18 is connected to a point between the positive terminal of the collector battery 22 and the negative terminal of the emitter battery 20. Hence, the base is common to both the emitter and collector circuits and the transistor 10 is connected for grounded-base operation. While the source of biasing potential has been illustrated as being two separate batteries, it should be understood, as indicated hereinbefore, that any source of unidirectional current may be used, such as rectified alternating current. Thus, for example, if a biasing resistor which is shunted by a capacitor is connected with the base 18, a single biasing battery may be connected between the base and collector.

By virtue of the biasing arrangement shown, it is to be noted that the emitter 14 will be positive with respect to the base 18. Hence, the emitter is biased in the forward or current conducting direction with respect to the base. The collector 16, however, is negative with respect to the base 18. Consequently, the collector is biased in the reverse or non-conducting direction with respect to the base.

A regenerative or positive feedback path for the transistor 10 is provided between the output or collector electrode 16 and the input or emitter electrode 14. This network includes a resistor 26 and a capacitor 28 connected in series between the collector 16 and the emitter 14, and a capacitor 30 and the resistor 24 connected in parallel between the emitter 14 and the common or base electrode 18 of the transistor 10. Thus, the resistance-capacitance feedback network of the present invention may be considered to be a simple Wein-bridge and is equivalent to the one illustrated in Figure 1, the transistor 10 replacing the amplifier indicated by the block diagram 8 in Figure 1. The output oscillatory signals may be taken from any convenient place in the circuit, as from between the emitter 16 and the base 18. For this purpose a pair of output leads 36 and 38 are provided; the lead 36 being coupled through a coupling or blocking capacitor 34 to the collector 16, and the lead 38 being connected to the base 18. It should be understood that the resistor 26 may be eliminated from the circuit if desired, the output collector impedance being sufficient for signal feedback.

Since, as referred to above, the collector output signal is in phase with the emitter input signal of the transistor 10, the phase requirements for sustained oscillation (i. e., the feedback signal in phase with the input signal) are met without the addition of phase-shifting networks or extra circuit components of any type to the circuit. Thus, a single three-electrode amplifying device may be used as the sole oscillator element in the oscillator circuit of the present invention. In addition, the current which is fed back from the collector 16 to the emitter 14, because of the current gain of transistor 10 and the circuit constants, will be of sufficient magnitude to be equal to the required input current. It should also be noted that sustained oscillation is not dependent on the negative resistance characteristics of the transistor.

The positive feedback network comprising the resistors 26 and 24 and the capacitors 28 and 30 is in effect a voltage divider. It will be noted that the signal input current to the emitter 14, is in phase with the output current from collector 16 at only one frequency as given hereinbefore by the equation for frequency. Furthermore, if the gain of the transistor is equal to or greater than A, as given by the voltage gain equation above, sustained oscillation occurs. It has been found that the waveform of the oscillations is best when the feedback factor is adjusted so as to just sustain oscillation.

For the circuit of Figure 2, $R_2$ as given in the expression for oscillator frequency referred to above, will include the emitter or input resistance of the transistor 10. This resistance is generally relatively low, in the order of 500 ohms for most point-contact transistors. Since the input resistance of the transistor is in parallel with the resistor 24, if the resistance of resistor 24 is made very large relative to the input resistance, $R_2$ will be substantially equal to the input resistance of the transistor. Accordingly, a constant current input for the transistor may be obtained by increasing resistor 24 and the voltage of battery 20.

By changing the values of any of the resistors or capacitors comprising the feedback network the frequency of oscillation may be varied. Since it is clear that the resistors 26 and 24, as well as the capacitors 28 and 30 serve to control the oscillator frequency, either the resistors alone, the capacitors alone, or both the resistors and capacitors may be adjusted for varying the tuning. For most applications, however, the oscillator frequency will preferably be varied by varying the emitter current. For this purpose, the position of the tap 25 on the resistor 24 can be changed, thus varying the emitter input resistance of the transistor. As the resistance of resistor 24 is decreased, the emitter input resistance decreases and the emitter current increases, thereby increasing the oscillator frequency. At the same time the feedback factor of the oscillator will be decreased, and if decreased sufficiently, oscillations will cease. As referred to above, the best oscillatory waveform will be obtained just before oscillations cease.

A circuit for the type illustrated in Figure 2 has given highly satisfactory results in operation. In one such circuit a point-contact transistor known commercially as type 2N32 was used with an emitter battery 20, of 1.5 volts and a collector battery 22, of 6.0 volts. While it will be understood that the circuit specifications may vary according to the design for any particular application; the following circuit specifications were used, by way of example only. The circuit oscillated at a frequency of approximately 1300 cycles and the output signal had a R. M. S. value of approximately 0.4 volt.

| | |
|---|---|
| Capacitors 28 and 30 | 0.47 and 0.1 microfarads, respectively |
| Resistors 26, 24, 32 | 510, 2700 and 1300 ohms, respectively |

While the above circuit values gave highly efficient operation, the load resistor 32 and the feedback resistor 26 may be increased to give a higher impedance feedback circuit. In this case, the coupling capacitor 28 must be decreased and the voltage of collector battery 22 increased. Such a circuit has also been found to operate efficiently.

An oscillator circuit as described herein may be useful for many purposes, for example, as a test oscillation generator. The circuit is characterized by both simplicity and reliability, and utilizes a minimum of space.

What is claimed is:

1. A feedback sine wave oscillation generator of the resistance-capacitance type comprising in combination, a semi-conductor device of the point-contact type having an emitter electrode, a collector electrode and a base electrode, means connected with said electrodes for applying biasing voltages thereto, a first resistor and a first capacitor connected in series between said collector and emitter electrodes, a second capacitor connected in series between said first capacitor and said base electrode, and a variable resistor connected in parallel with said second capacitor and between said emitter and base electrodes for varying the current in said emitter electrode thereby to vary the frequency of oscillation of said generator.

2. A feedback sine wave oscillation generator comprising in combination, a semi-conductor device having an emitter, a collector and a base electrode, said device having a current gain greater than unity, means for biasing said emitter and base electrodes in a relatively conducting direction and said collector and base electrodes in a relatively non-conducting direction, a feedback circuit providing regenerative feedback between said collector and emitter electrodes, said circuit comprising a first resistor and a first capacitor connected in series between said collector and emitter electrodes, and a second resistor and a second capacitor connected in parallel between said emitter and base electrodes, and means for varying the resistance of said second resistor for varying the current in said emitter electrode, thereby to vary the frequency at which said generator oscillates.

3. In an oscillator circuit the combination comprising a semi-conductor device having a current gain greater than unity, an emitter, a base and a collector electrode for said device, means for biasing said electrodes, regenerative feedback means coupled between said collector and emitter electrodes, said means comprising a frequency selective resistance-capacitance network for applying signals from said collector electrode to said emitter electrode of sufficient amplitude and proper phase to sustain oscillation of said circuit.

4. A feedback sine wave oscillation generator of the resistance-capacitance type comprising in combination, a semi-conductor device having an emitter electrode, a collector electrode and a base electrode, said device having a current gain greater than unity, energizing means connected with said electrodes, a first resistor and a first capacitor connected in series between said collector and emitter electrodes, a second capacitor connected in series between said first capacitor and said base electrode, an impedence element connected between said collector and base electrodes, and variable impedance means connected in parallel with said second capacitor and between said emitter and base electrodes for varying the current in said emitter electrode thereby to vary the frequency of oscillation of said generator.

5. A feedback sine wave oscillation generator of the resistance-capacitance type comprising in combination, a semi-conductor device having an emitter electrode, a collector electrode and a base electrode, said device having a current gain greater than unity, energizing means connected with said electrodes, a first resistor and a first capacitor connected in series between said collector and emitter electrodes, a second capacitor connected in series between said first capacitor and said base electrode, and variable impedance means connected in parallel with said second capacitor and between said emitter and base electrodes for varying the current in said emitter electrode thereby to vary the frequency of oscillation of said generator.

6. A feedback sine wave oscillation generator comprising in combination, a semi-conductor device having an emitter, a collector and a base electrode, said device having a current gain greater than unity, means for biasing said emitter and base electrodes in a relatively conducting direction and said collector and base electrodes in a relatively non-conducting direction, a feedback circuit providing regenerative feedback between said collector and emitter electrodes, said circuit comprising a first resistor and a first capacitor connected in series between said collector and emitter electrodes, and a second resistor and a second capacitor connected in parallel between said emitter and base electrodes, a resistor connected between said collector and base electrode, and means for varying the resistance of said second resistor for varying the current in said emitter electrode, thereby to vary the frequency at which said generator oscillates.

7. In an oscillator circuit the combination comprising a semi-conductor device having a current gain greater than unity, an emitter, a base and a collector electrode for said device, energizing means connected with said electrodes, and a positive feedback connection between said collector and emitter electrodes, said connection comprising a frequency selective resistance-capacitance network for applying signals from said collector electrode to said emitter electrode of sufficient amplitude and proper phase to sustain oscillation of said circuit.

8. A feedback sine wave oscillation generator of the resistance-capacitance type comprising in combination, a semi-conductor device having an emitter electrode, a collector electrode and a base electrode, said device having a current gain greater than unity, means for biasing said emitter and base electrodes in a relatively conducting direction and said collector and base electrodes in a relatively non-conducting direction, and a resistance-capacitance feedback circuit connected between said collector and emitter electrodes for applying signals from said collector electrode to said emitter electrode of proper phase and magnitude to sustain oscillation.

9. In an oscillator circuit the combination comprising, a semi-conductor device having a collector electrode, an emitter electrode, and a base electrode, said device having a current gain greater than unity, means for biasing said emitter and base electrodes in a relatively conducting direction and said collector and base electrodes in a relatively non-conducting direction, and a resistance-capacitance feedback circuit connected between said collector and emitter electrodes for applying signals from said collector electrode to said emitter electrode modified in phase and magnitude to sustain oscillation of said circuit and including means for varying the emitter current of said device and thereby the frequency of oscillations of said circuit.

References Cited in the file of this patent

UNITED STATES PATENTS

| | | |
|---|---|---|
| 2,268,872 | Hewlett | Jan. 6, 1942 |
| 2,556,296 | Rack | June 12, 1951 |
| 2,609,459 | Bergson | Sept. 2, 1952 |
| 2,663,800 | Herzog | Dec. 22, 1953 |

OTHER REFERENCES

Article: "Duality As A Guide in Transitor Design," from Bell Tel. Monograph #1874, reprinted from Bell Technical Journal, vol. 30, pp. 331–417 for April 1951.

Article: "Transistor Circuit Design," by Raisbeek, from "Electronics," vol. 24 No. 12 for Dec. 1951, pp. 128–132, 134 paragraph 4.5, pages 115 to 120 of vol. 19 ("Waveforms") MIT Series; April 5, 1949.